(12) United States Patent
Wang et al.

(10) Patent No.: US 10,871,672 B2
(45) Date of Patent: Dec. 22, 2020

(54) DISPLAY PANEL, PRODUCTION METHOD, AND DISPLAY APPARATUS

(71) Applicants: BOE TECHNOLOGY GROUP CO., LTD., Beijing (CN); Ordos Yuansheng Optoelectronics Co., Ltd., Inner Mongolia (CN)

(72) Inventors: Zifeng Wang, Beijing (CN); Fengguo Wang, Beijing (CN); Dawei Shi, Beijing (CN)

(73) Assignees: BOE TECHNOLOGY GROUP CO., LTD., Beijing (CN); ORDOS YUANSHENG OPTOELECTRONICS CO., LTD., Inner Mongilia (CN)

( * ) Notice: Subject to any disclaimer, the term of this patent is extended or adjusted under 35 U.S.C. 154(b) by 22 days.

(21) Appl. No.: 15/974,672

(22) Filed: May 8, 2018

(65) Prior Publication Data

US 2019/0129238 A1 May 2, 2019

(30) Foreign Application Priority Data

Oct. 31, 2017 (CN) .......................... 2017 1 1050384

(51) Int. Cl.
*G02F 1/1335* (2006.01)
*G02F 1/13357* (2006.01)
(Continued)

(52) U.S. Cl.
CPC ...... *G02F 1/133512* (2013.01); *G02F 1/1368* (2013.01); *G02F 1/133514* (2013.01);
(Continued)

(58) Field of Classification Search
CPC ................................................. G02F 1/133512
See application file for complete search history.

(56) References Cited

U.S. PATENT DOCUMENTS 7,443,417 B1 10/2008 Iijima
2015/0244958 A1* 8/2015 Ohguro .................. H04N 5/374
348/277
(Continued)

FOREIGN PATENT DOCUMENTS

CN 1360220 A 7/2002
CN 101393346 A 3/2009
(Continued)

OTHER PUBLICATIONS

First Chinese Office Action dated Dec. 4, 2019, received for corresponding Chinese Application No. 201711050384.8, 15 pages.

*Primary Examiner* — Edmond C Lau
(74) *Attorney, Agent, or Firm* — Kinney & Lange, P.A.

(57) ABSTRACT

This disclosure provides a display panel, a production method, and a display apparatus. The display panel comprises a first substrate, a second substrate, and a liquid crystal layer provided between the first substrate and the second substrate. The first substrate is provided with a black matrix, and the second substrate is provided oppositely to the first substrate and is provided with a light-shielding layer pattern. A surface of the light-shielding layer pattern has a light-reflecting property, and a projection of at least a part of the light-shielding layer pattern on the second substrate extends beyond a projection of the black matrix on the second substrate.

6 Claims, 7 Drawing Sheets

(51) Int. Cl.
*H01L 27/12* (2006.01)
*G02F 1/1368* (2006.01)
*G02F 1/1362* (2006.01)

(52) U.S. Cl.
CPC .. *G02F 1/133602* (2013.01); *G02F 1/136209* (2013.01); *H01L 27/1214* (2013.01); *G02F 2201/123* (2013.01); *G02F 2203/02* (2013.01)

(56) References Cited

U.S. PATENT DOCUMENTS

| | | | |
|---|---|---|---|
| 2018/0061894 A1* | 3/2018 | Kim | H01L 27/322 |
| 2018/0210280 A1* | 7/2018 | Chen | H01L 51/0097 |
| 2019/0056618 A1 | 2/2019 | Xu | |
| 2019/0086715 A1 | 3/2019 | Bai et al. | |

FOREIGN PATENT DOCUMENTS

| | | | |
|---|---|---|---|
| CN | 102749752 A | | 10/2012 |
| CN | 104391396 A | | 3/2015 |
| CN | 105511153 A | | 4/2016 |
| CN | 105810799 A | | 7/2016 |
| CN | 106292048 A | | 1/2017 |
| CN | 106646682 A | | 5/2017 |
| CN | 106773279 A | | 5/2017 |
| CN | 107255885 A | | 10/2017 |
| KR | 20060053563 A | | 5/2006 |
| KR | 20060130336 A | | 12/2006 |
| KR | 20110073725 A | * | 6/2011 |
| KR | 20110073725 A | | 6/2011 |

* cited by examiner

DISPLAY PANEL, PRODUCTION METHOD, AND DISPLAY APPARATUS

CROSS-REFERENCE TO RELATED APPLICATION

This application claims the priority of Chinese Patent Application No. 201711050384.8 filed on Oct. 31, 2017, the contents of which are incorporated as a part of this application by reference in its entirety.

TECHNICAL FIELD

Embodiments of this disclosure relate to a display panel, a production method, and a display apparatus.

BACKGROUND

As needed by the development of electronic science and technology and the development of the society, thin film transistor liquid crystal display panels have been widely used in various display apparatuses, due to the characteristics such as good lightness and thinness, good shock resistance, wide view angle, high contrast, and the like.

A liquid crystal display panel typically comprises an array substrate having a thin film transistor, a color filter substrate having a color filter, and a liquid crystal material between the array substrate and the color filter substrate.

SUMMARY

At least one embodiment of this disclosure provides a display panel, comprising: a first substrate which is provided with a black matrix; a second substrate which is provided oppositely to the first substrate and is provided with a light-shielding layer pattern; and a liquid crystal layer which is provided between the first substrate and the second substrate; wherein a surface of the light-shielding layer pattern has a light-reflecting property, and a projection of at least a part of the light-shielding layer pattern on the second substrate extends beyond a projection of the black matrix on the second substrate.

For example, the display panel provided in one embodiment of this disclosure further comprises a plurality of sub-pixels in an array arrangement, wherein on the first substrate, a black matrix line of the black matrix is provided between two adjacent sub-pixels; and on the second substrate, the light-shielding layer pattern comprises a light-shielding line provided in correspondence with the black matrix line, and a projection of the light-shielding line on the second substrate extends beyond a projection of the black matrix line on the second substrate.

For example, in the display panel provided in one embodiment of this disclosure, the light-shielding line is provided in one-to-one correspondence with the black matrix line, and on both sides of the black matrix line, the projection of the light-shielding line on the second substrate extends beyond the projection of the black matrix line on the second substrate.

For example, in the display panel provided in one embodiment of this disclosure, the line width of the light-shielding line is approximately 1.1 to 1.3 times that of the black matrix line.

For example, in the display panel provided in one embodiment of this disclosure, at least two adjacent light-shielding lines are provided in correspondence with the black matrix line, wherein a projection of one of the at least two adjacent light-shielding lines on the second substrate extends beyond a projection of the black matrix line on the second substrate on a first side of the black matrix line, and a projection of the other of the at least two adjacent light-shielding lines on the second substrate extends beyond the projection of the black matrix line on the second substrate on a second side of the black matrix line.

For example, in the display panel provided in one embodiment of this disclosure, the surface of the light-shielding layer pattern departing from the first substrate is a rough surface.

For example, in the display panel provided in one embodiment of this disclosure, the metal material comprises silver, aluminum, chromium, copper, molybdenum, titanium, an aluminum neodymium alloy, a copper molybdenum alloy, a molybdenum tantalum alloy, a molybdenum neodymium alloy, or any combination thereof.

For example, in the display panel provided in one embodiment of this disclosure, the light-shielding layer pattern is formed of a photonic crystal.

For example, in the display panel provided in one embodiment of this disclosure, the photonic crystal comprises a plurality of silicon oxide layers and a plurality of silicon nitride layers which are alternately laminated.

For example, in the display panel provided in one embodiment of this disclosure, the light-shielding layer pattern is provided below a thin film transistor of the sub-pixel.

At least one embodiment of this disclosure provides a method for producing a display panel, comprising the steps of: providing a first substrate which is formed with a black matrix; providing a second substrate which is provided oppositely to the first substrate and is provided with a light-shielding layer pattern; and providing a liquid crystal layer between the first substrate and the second substrate; wherein a surface of the light-shielding layer pattern has a light-reflecting property, and a projection of at least a part of the light-shielding layer pattern on the second substrate extends beyond a projection of the black matrix on the second substrate.

For example, in the method provided in one embodiment of this disclosure, forming the light-shielding layer pattern comprises the steps of: forming a metal light-shielding layer on the second substrate, performing patterning on the metal light-shielding layer by a photolithographic process to form the light-shielding layer pattern, and forming the surface of the light-shielding layer pattern departing from the first substrate into a rough surface.

For example, in the method provided in one embodiment of this disclosure, the light-shielding layer pattern is formed of a photonic crystal.

For example, in the method provided in one embodiment of this disclosure, the photonic crystal is formed by alternately laminating a plurality of silicon oxide layers and a plurality of silicon nitride layers.

For example, in the method provided in one embodiment of this disclosure, the display panel comprises a plurality of sub-pixels in an array arrangement, wherein on the first substrate, a black matrix line of the black matrix is provided between two adjacent sub-pixels; and on the second substrate, the light-shielding layer pattern comprises a light-shielding line provided in correspondence with the black matrix line, and a projection of the light-shielding line on the second substrate extends beyond a projection of the black matrix line on the second substrate.

For example, in the method provided in one embodiment of this disclosure, the light-shielding line is provided in one-to-one correspondence with the black matrix line, and on both sides of the black matrix line, the projection of the light-shielding line on the second substrate extends beyond the projection of the black matrix line on the second substrate For example, in the method provided in one embodiment of this disclosure, the line width of the light-shielding line is approximately 1.1 to 1.3 times that of the black matrix line.

For example, in the method provided in one embodiment of this disclosure, at least two adjacent light-shielding lines are provided in correspondence with the black matrix line, wherein a projection of one of the at least two adjacent light-shielding lines on the second substrate extends beyond a projection of the black matrix line on the second substrate on a first side of the black matrix line, and a projection of the other of the at least two adjacent light-shielding lines on the second substrate extends beyond the projection of the black matrix line on the second substrate on a second side of the black matrix line.

For example, in the method provided in one embodiment of this disclosure, the light-shielding layer pattern is produced from a metal material, and the surface of the light-shielding layer pattern departing from the first substrate is a rough surface.

At least one embodiment of this disclosure provides a display apparatus, and this display apparatus comprises the display panel of any one of the embodiments of this disclosure.

For example, the display apparatus provided in one embodiment of this disclosure further comprises a backlight unit, wherein the backlight unit is provided on one side of the second substrate, so that a light emitted from the backlight unit enters the display panel through the light-shielding layer pattern of the display panel.

BRIEF DESCRIPTION OF THE DRAWINGS

In order to illustrate the technical solutions in embodiments of this disclosure more clearly, the accompanying drawings of embodiments will be simply introduced below. It is apparent that the accompanying drawings described below are merely some embodiments related to this disclosure but not limitations of this disclosure.

DETAILED DESCRIPTION

In order to enable the objects, technical solutions, and advantages of embodiments of this disclosure to be clearer, the technical solutions of embodiments of this disclosure will be described clearly and fully below in conjunction with accompanying drawings of embodiments of this disclosure. Obviously, the embodiments described are a part of the embodiments of this disclosure, rather than all embodiments. Based on the embodiments described of this disclosure, all other embodiments obtained by those of ordinary skill in the art without performing inventive work belong to the scope protected by this disclosure.

Unless defined otherwise, the technical terms or scientific terms used in this disclosure should have general meanings as understood by those of ordinary skill in the art to which this disclosure belongs. The word, such as "first", "second", or the like, used in this disclosure does not represent any order, quantity, or importance, but is used to distinguish different constituent parts. Also, a similar word, such as "a", "an", "the", or the like, does not represent quantity limitations either, but represents that there is at least one. The word, such as "include", "comprise", or the like, used in this disclosure means that the element or article occurring before this word encompasses the element or article and the equivalent thereof enumerated after this word and does not exclude other elements or articles. The word, such as "connection", "attachment", or the like, is not limited to a physical or mechanical connection, but may include an electric connection, either direct or indirect. The word, such as "above", "below", "left", "right", or the like, is only used to indicate a relative position relationship. After the absolute position of a described object is changed, this relative position relationship may be changed accordingly.

A liquid crystal display panel typically comprises an array substrate, a color filter substrate, and a liquid crystal material between the array substrate and the color filter substrate. The liquid crystal display panel has a plurality of sub-pixels. Typically, the color filter substrate has a black matrix to define these sub-pixels so as to prevent light crosstalk between these sub-pixels.

Figure 1A:
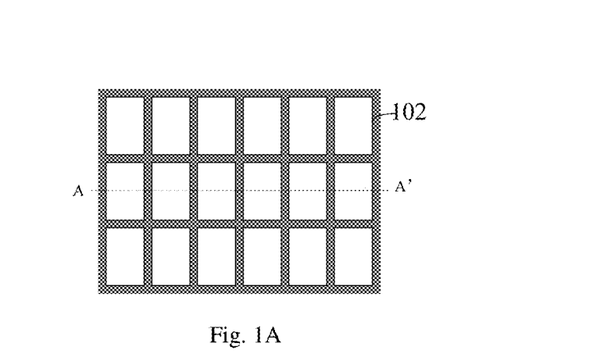
FIG. 1A shows a plan view of a structure of a black matrix.
Figure 1B:
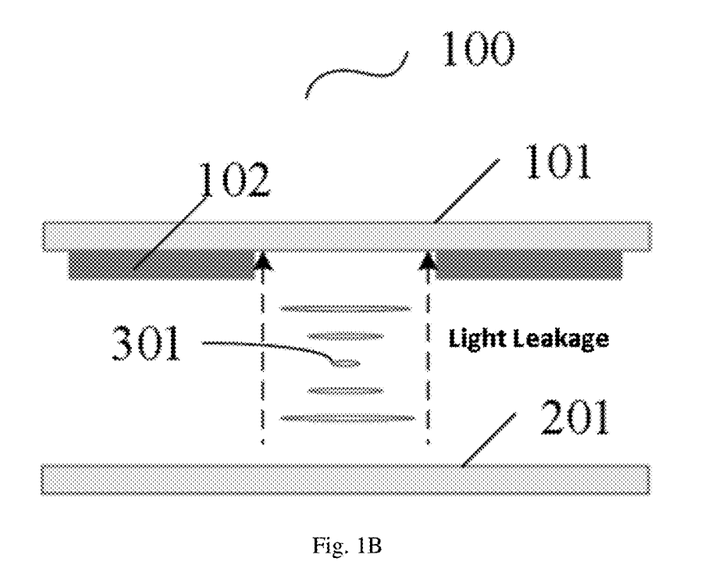
FIG. 1B shows a schematic diagram of a sectional structure of a display panel.

FIG. 1A shows a plan view of a black matrix, and this black matrix exhibits a grid shape and each opening (square), for example, corresponds to a sub-pixel unit. FIG. 1B shows a sectional view of a liquid crystal display panel comprising a black matrix 102 along AA' in FIG. 1A. As shown in the figure, the liquid crystal display panel 10 comprises a first substrate 101 provided a black matrix 102, a second substrate 201, and a liquid crystal layer 301 therebetween. The black matrix is provided between adjacent sub-pixels of the liquid crystal display panel. It is possible to shield members such as thin film transistors, data lines, gate lines, and the like provided on the array substrate and absorb visible light which is not normally controlled by liquid crystal deflection and other stray light which influences the display effect, so that the liquid crystal display panel has a good display effect.

However, in the display panel, undesirable light leakage will occur when the shielding by the black matrix is insufficient. Severe light leakage will result in degraded or unusable display panel products, even though slight light leakage will give rise to problems such as increased dark state brightness, reduced display panel contrast, and the like. In order to effectively control light leakage at the edge position of the sub-pixel, the black matrix may be typically made as wide as possible. However, an excessively wide black matrix will reduce the aperture ratio of the display panel, resulting in reduced brightness and contrast; and if compensation is made by increasing backlight brightness, the energy consumption of the product will be increased and the image quality will be reduced.

At least one embodiment of this disclosure provides a display panel and a production method. This display panel comprises a first substrate, a second substrate, and a liquid crystal layer; the first substrate is provided with a black matrix; the second substrate is provided oppositely to the first substrate and is provided with a light-shielding layer pattern; the liquid crystal layer is between the first substrate and the second substrate; a surface of the light-shielding layer pattern has a light-reflecting property, and a projection of at least a part of the light-shielding layer pattern on the second substrate extends beyond a projection of the black matrix on the second substrate.

In the display panel of the embodiment described above, in cooperation with the black matrix, the light-shielding layer pattern may effectively shield light leakage at the edge position of the black matrix so as to effectively improve the contrast and the display effect of the display panel. At the meanwhile, by means of the light-reflecting effect of the light-shielding layer pattern (against light from, for example, the backlight unit), it is possible to effectively reduce the light loss in ineffective areas of the display panel, improve the brightness, and reduce the energy consumption.

Illustration will be made by several embodiments below. It is worth noting that the same reference numeral refers to the same element throughout the specification.

Figure 2A:
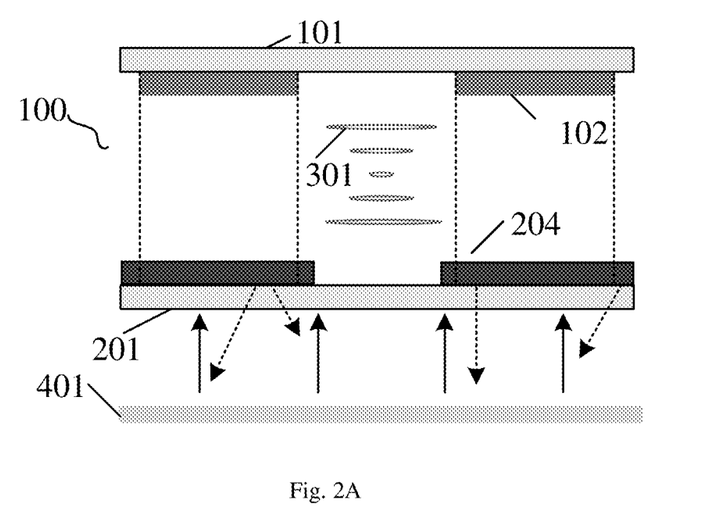
FIG. 2A shows a schematic diagram of a sectional structure of a display panel according to a first embodiment of this disclosure.

An embodiment of the disclosure provides a display panel, and this display panel has a plurality of sub-pixels. FIG. 2A shows a schematic diagram of a sectional structure of a display panel 100 provided according to this embodiment. For example, the sectional view of FIG. 2A can be referred to line AA' shown in FIG. 1A, and others are the same as those in FIG. 2B, etc.

With reference to FIG. 2A, this display panel 100 comprises a first substrate 101, a second substrate 201, a liquid crystal layer 301, a black matrix 102, and a light-shielding layer pattern 204. For example, the first substrate 101 and the second substrate 201 are provided oppositely to each other, and are bonded to each other by a sealant to form a liquid crystal cell, wherein the first substrate 101 is a display side of the display panel, which is a side facing to the viewer. This liquid crystal panel may be any one of various types of display panels, for example a vertical electric field type, a horizontal electric field type, and the like. This embodiment is not limited to the particular type of the display panel.

In this embodiment, the display area of the display panel comprises pixel units distributed in arrays, each pixel unit comprises a plurality of sub-pixel units, and each sub-pixel unit may be used for displaying different colors. For example, when a pixel unit comprises three sub-pixel units, the three sub-pixel units may be used for displaying three colors of red, green, and blue, respectively. In this embodiment, the number of sub-pixel units in the same pixel unit is not specially defined, and for example, it may be three, four, or more.

The material of the first substrate 101 may be a glass substrate, a quartz substrate, a plastic substrate, or other substrates of suitable materials. For example, in this embodiment, the first substrate 101 may be a color filter substrate, on which RGB color filters distributed in arrays may be formed, and each color filter is provided in the opening of the black matrix and is provided in one-to-one correspondance with the sub-pixel unit. The structures such as the color filter and the like may be provided in direct contact with or separated from the black matrix.

As shown in FIG. 2A, the material of the second substrate 201 may be the same as the material of the first substrate 101. In this embodiment, the second substrate may be an array substrate, on which a sub-pixel unit defined by crossing a plurality of gate lines and a plurality of data lines respectively, and each sub-pixel unit comprises a thin film transistor as a switch element and a pixel electrode used for controlling the alignment of liquid crystal. For example, in the thin film transistor of each pixel, the gate electrode is electrically connected to or integrally formed with the corresponding gate line, the source electrode is electrically connected to or integrally formed with the corresponding data line, and the drain electrode is electrically connected to or integrally formed with the corresponding pixel electrode. The above structures such as circuit layers and the like may be formed on the light-shielding layer pattern 204, and for example, covers this light-shielding layer pattern 204 and departs more from the second substrate 201.

The liquid crystal layer 301 and a spacer (for example, a columnar spacer or a spherical spacer) for ensuring the cell thickness of the liquid crystal cell are provided in the space between the first substrate 101 and the second substrate 201.

As shown in FIG. 2A, the black matrix 102 is provided on the surface of the first substrate 101 facing to the second substrate 201, but is not limited thereto. For example, the black matrix may also be formed on the surface of the first substrate 101 departing from the second substrate 201. Furthermore, FIG. 1A may be referred to, the plan view of this black matrix exhibits a grid shape and each opening (square), for example, corresponds to a sub-pixel unit. In the display area, the black matrix line is provided between two adjacent sub-pixels. The black matrix 102 may shield the light which is not controlled by the deflection of the liquid crystal layer 301 and the light which influences the display effect. The material of the black matrix includes but is not limited to carbon black particles, or metal materials (for example chromium) or metal oxide materials (or chromium oxide) coated with an organic resin material.

As shown in FIG. 2A, the light-shielding layer pattern 204 is provided on the second substrate 201; and for example, the light-shielding layer pattern 204 may have the same shape as that of the black matrix 102. However, this embodiment is not limited thereto. Further, for example, the light-shielding line of the light-shielding layer pattern 204 is provided in one-to-one correspondence with the black matrix line of the black matrix 102 in the display area, thereby defining respective sub-pixels. In this embodiment, the line width of each light-shielding line is greater than the line width of each black matrix line (for example, see dashed lines in FIG. 2A). For example, in this embodiment, the line width of the light-shielding line is approximately 1.1 to 1.3 times that of the black matrix line. In the direction of line width, both sides of each light-shielding line extends beyond both sides of each black matrix line respectively, so that the area shielded by the light-shielding layer pattern may be greater than the area shielded by the black matrix. Therefore, the crosstalk of light from the outside (for example, light used for a backlight unit 401 of this liquid crystal panel) between sub-pixels may be better prevented.

In an example of this embodiment, with respect to the design of the light-shielding layer pattern 204, each light-shielding line is designed to be bilaterally symmetrically wider than the black matrix line. In practical production and processing, each light-shielding line is not strictly bilaterally symmetrically wider than the black matrix line, due to the factors such as the fluctuation of the relative position in the deposition process of film layers of the light-shielding layer pattern 204 and the black matrix 102, the fluctuation of the shrinkage of the first substrate 101 and/or the second substrate 201 in a high temperature process, the fluctuation of the alignment accuracy, and the like.

In this embodiment, the light-shielding layer pattern 204 may be produced from a metal material or a non-metal material, and for example, the metal material comprises silver, aluminum, chromium, copper, molybdenum, titanium, an aluminum neodymium alloy, a copper molybdenum alloy, a molybdenum tantalum alloy, a molybdenum neodymium alloy, or any combination thereof. The light-shielding layer pattern 204 produced from the opaque metal material described above may improve the light-shielding effect of the light-shielding layer pattern 204. For example, when this light-shielding layer pattern is provided below the thin film transistor of the sub-pixel (i.e., a light incident side), it may further prevent the thin film transistor from generating photon-generated carriers upon irradiation of external light (for example, the back light source 401 used for this liquid crystal panel) and resultant drain current.

In this embodiment, since the line width of the light-shielding line is greater than the line width of the black matrix line, the relatively wide light-shielding layer pattern 204 may cause the light flux of the display area of this display panel to be smaller. However, since the surface of the light-shielding layer pattern 204 composed of metal has a light-reflecting property, and for example, since silver has a relatively high reflectance when the metal material is silver in an example of this embodiment, when an external light (for example, the back light source 401 used for this liquid crystal panel) is incident to the light-shielding layer pattern 204 through the second substrate 201, the light is subjected to specular reflection or diffuse reflection on the lower surface of the light-shielding layer pattern 204, returned to the back light source, and then reflected to the direction of light emission by the light-reflecting layer and the like of the back light source. For example, the light may be subjected to specular reflection several times by the surface of the light-shielding layer pattern 204, and is finally transmitted through the position of the pixel opening. Therefore, by means of reflection of light, the light loss in ineffective areas of this display panel may be reduced, and in turn it is possible to improve the brightness and reduce the energy consumption.

In this embodiment, each light-shielding line of the light-shielding layer pattern 204 is provided in one-to-one correspondence with each black matrix line of the black matrix 102, and the line width of each light-shielding line is greater than the line width of each black matrix line. Therefore, in the case that the aperture ratio of the display panel is substantially not reduced, the light-shielding layer pattern 204 may effectively shield light leakage at the position where the edge liquid crystal driving of the black matrix 102 is insufficient and reduce the brightness of dark images so as to effectively reduce the risk of light leakage and improve the contrast of the display panel. For example, the light-shielding layer pattern 204 may also prevent the thin film transistor from generating photon-generated carriers upon irradiation of external light. At the meanwhile, due to the light-reflecting effect of the surface of the light-shielding layer pattern 204, the light loss in ineffective areas of this display panel may be reduced, and in turn it is possible to improve the brightness and reduce the energy consumption.

Figure 2B:
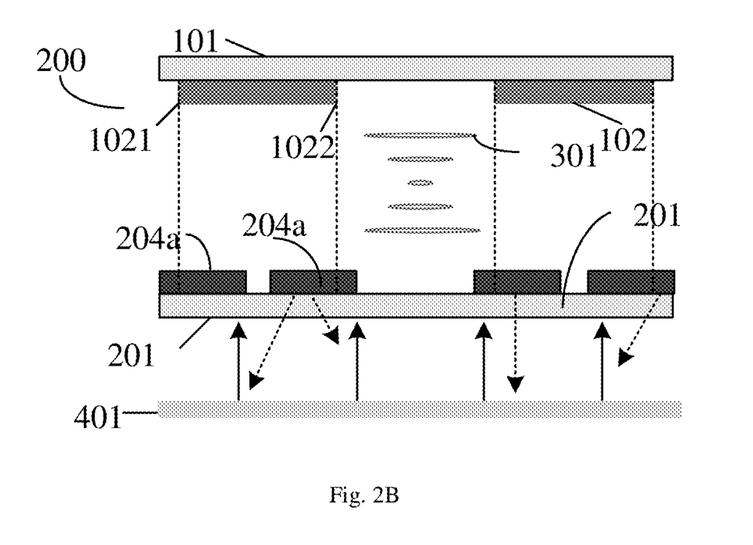
FIG. 2B shows a schematic diagram of a sectional structure of another display panel according to a first embodiment of this disclosure.

FIG. 2B shows a schematic diagram of a sectional structure of a display panel 200, which is a variation of the structure shown in FIG. 2A.

With reference to FIG. 2B, the structure of the display panel of this example is substantially the same as the structure of the display panel described in FIG. 2A, except the shape of the light-shielding layer pattern 204a.

As shown in FIG. 2B, each black matrix line is provided in correspondence with two light-shielding lines, and there is a certain gap between two light-shielding lines. One of the two light-shielding lines extends in the direction of line width beyond a first side 1021 (for example, see dashed lines in FIG. 2B) of the black matrix line, and the other one of the two light-shielding lines extends in the direction of line width beyond a second side 1022 (for example, see dashed lines in FIG. 2B) of the black matrix line. For example, the line widths of the two light-shielding lines may be the same as each other. This example includes it but is not limited thereto. For example, the line widths of the two light-shielding lines may also be different. For example, the two light-shielding lines are substantially axially symmetrically provided on both sides of each black matrix line respectively.

In this example, the light-shielding layer pattern 204a may be produced from a metal material or a non-metal material, and for example, the metal material comprises silver, aluminum, chromium, copper, molybdenum, titanium, an aluminum neodymium alloy, a copper molybdenum alloy, a molybdenum tantalum alloy, a molybdenum neodymium alloy, or any combination thereof. The light-shielding layer pattern 204a produced from the opaque metal material described above may improve the light-shielding effect of the light-shielding layer pattern 204a. For example, when this light-shielding layer pattern is provided below the thin film transistor of the sub-pixel (i.e., a light incident side), it may prevent the thin film transistor from generating photon-generated carriers upon irradiation of external light (for example, the back light source 401 used for this liquid crystal panel).

In this example, since one of the two light-shielding lines extends in the direction of line width beyond a first side 1021 (for example, see dashed lines in FIG. 2B) of the black matrix line, and the other one of the two light-shielding lines extends in the direction of line width beyond a second side 1022 (for example, see dashed lines in FIG. 2B) of the black matrix line, the light-shielding layer pattern 204a may cause the light flux of the display area of this display panel to be smaller. However, since the surface of the light-shielding layer pattern 204a composed of metal has a light-reflecting property, and for example, since silver has a relatively high reflectance when the metal material is silver in an example of this embodiment, when an external light (for example, the back light source 401 used for this liquid crystal panel) is incident to the light-shielding layer pattern 204a through the second substrate 201, the light is subjected to specular reflection or diffuse reflection on the lower surface of the light-shielding layer pattern 204a, returned to the back light source, and then reflected to the direction of light emission by the light-reflecting layer and the like of the back light source. The light may be subjected to specular reflection or diffuse reflection several times by the surface of the light-shielding layer pattern 204a, and is finally transmitted through the position of the pixel opening. By means of specular reflection or diffuse reflection of light, the light loss in ineffective areas of this display panel may be reduced, and in turn it is possible to improve the brightness and reduce the energy consumption.

It is worth noting that the distance between two light-shielding lines provided in correspondence with each black matrix line may vary according to practical situations, based on requirements such as optical properties of the product, the size of the display panel, the precision, the aperture ratio, and the like.

It is to be indicated that in this example, each black matrix line includes but is not limited to being provided in correspondence with two light-shielding lines. For example, each black matrix line may be provided in correspondence with three light-shielding lines, four light-shielding lines, or more. Corresponding adjustments may be particularly made according to the overall design requirements of the product. No matter how many light-shielding lines are provided in correspondence with each black matrix line, the light-shielding line in correspondence with the first side 1021 of the black matrix line should extend in the direction of line width beyond the first side 1021 of the black matrix line, and the light-shielding line in correspondence with the second side 1022 of the black matrix line should extend in the direction of line width beyond the second side 1022 of the black matrix line.

In this example, each black matrix line of the black matrix 102 is provided in correspondence with two light-shielding lines of the light-shielding layer pattern 204a, and the two light-shielding lines extend in the direction of line width beyond both sides of the black matrix line respectively. Therefore, the light-shielding layer pattern 204a may effectively shield the light leakage at the position where the edge liquid crystal driving of the black matrix 102 is insufficient and reduce the brightness of dark images so as to effectively reduce the risk of light leakage and improve the contrast. At the meanwhile, due to the light-reflecting effect of the surface of the light-shielding layer pattern 204a, the light loss in ineffective areas of this display panel may be reduced, and in turn it is possible to improve the brightness and reduce the energy consumption.

Figure 2C:
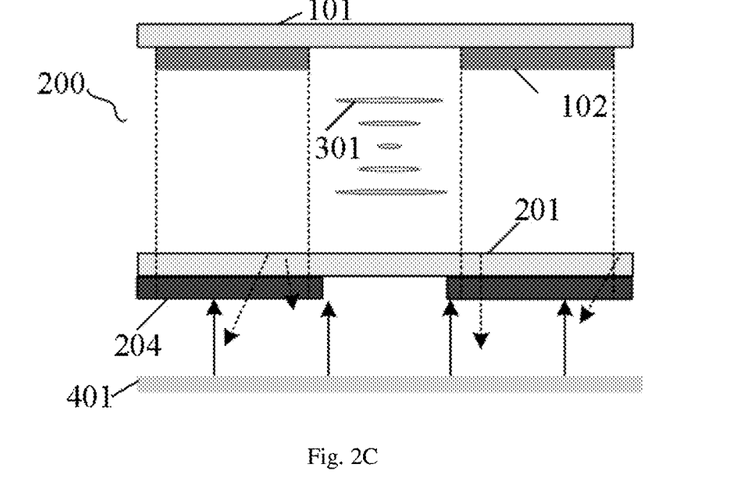
FIG. 2C shows a schematic diagram of a sectional structure of another display panel according to a first embodiment of this disclosure.

FIG. 2C shows a schematic diagram of a sectional structure according to a display panel 200, which is a variation of the structure shown in FIG. 2A.

With reference to FIG. 2C, the structure of the display panel of this example is substantially the same as the structure of the display panel described in FIG. 2A, except that the position of the light-shielding layer pattern 204 on the second substrate 201. In this example, the light-shielding layer pattern 204 is on the side of the second substrate 201 departing from the first substrate 101. Modifications may also be made to the exemplary light-shielding layer pattern shown in FIG. 2B.

Figure 3:
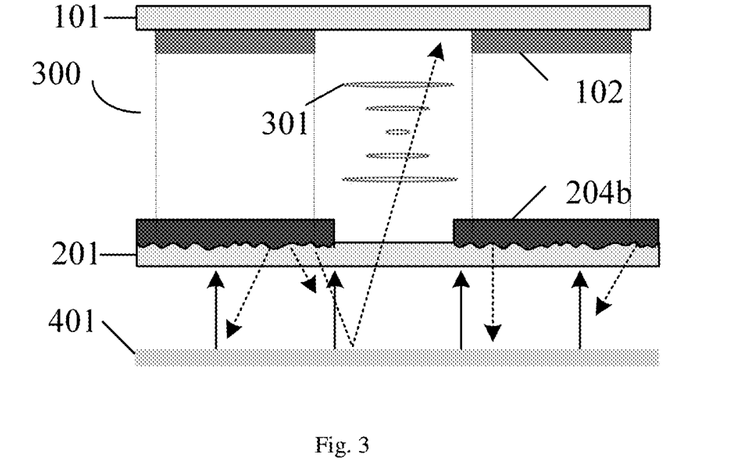
FIG. 3 shows a schematic diagram of a sectional structure of a display panel according to a second embodiment of this disclosure.

An embodiment of the disclosure provides a display panel. FIG. 3 shows a schematic diagram of a sectional structure of a display panel 300 according to a second embodiment of this disclosure.

With reference to FIG. 3, the structure of the display panel of this embodiment is substantially the same as the structure of the display panel described in FIG. 2A in the first embodiment, except that the surface of the light-shielding layer pattern 204b departing from the first substrate 101 is a rough surface. The surface of the light-shielding layer pattern 204b departing from the first substrate 101 is a surface in direct contact with the second substrate 201 as shown in the figure. In another example, if the light-shielding layer pattern is provided on the side of the second substrate departing from the first substrate 101, the surface of the light-shielding layer pattern 204b departing from the first substrate 101 is a surface which is not in direct contact with the second substrate 201.

In this embodiment, the light-shielding layer pattern 204b may be produced from a metal material or a non-metal material, and for example, the metal material comprises silver, aluminum, chromium, copper, molybdenum, titanium, an aluminum neodymium alloy, a copper molybdenum alloy, a molybdenum tantalum alloy, a molybdenum neodymium alloy, or any combination thereof. The light-shielding layer pattern 204b produced from the opaque metal material described above may improve the light-shielding effect of the light-shielding layer pattern 204b. For example, it is also possible to prevent the thin film transistor from generating photon-generated carriers upon irradiation of external light.

As shown in FIG. 3, when an external light (for example, the back light source 401 used for this liquid crystal panel) is incident to the light-shielding layer pattern 204b through the second substrate 201, the light is subjected to diffuse reflection on the rough lower surface of the light-shielding layer pattern 204b, returned to the back light source, and then reflected to the direction of light emission by the light-reflecting layer and the like of the back light source. For example, the light may be subjected to diffuse reflection several times by the surface of the light-shielding layer pattern 204b, and is finally transmitted through the position of the pixel opening. Therefore, in the case that optical index matching films are not additionally increased, the utilization rate of light source in ineffective areas may be increased.

It is to be indicated that in this embodiment, the position corresponding relationship between the light-shielding line of the light-shielding layer pattern 204b and the black matrix line of the black matrix 102 is not limited to the circumstances described above. For example, the position corresponding relationship between the light-shielding line of the light-shielding layer pattern 204b and the black matrix line of the black matrix 102 may also be the same as the circumstances described in FIG. 2B, and verbose words are omitted herein.

In another example of this embodiment, besides the structure described above, the light-shielding line of the light-shielding layer pattern 204b is provided in one-to-one correspondence with the black matrix line of the black matrix 102, and the line width of the light-shielding line is greater than the line width of the black matrix line (as shown by dashed lines in the figure). Therefore, in the case that the aperture ratio of the display side is substantially not reduced, the light-shielding layer pattern 204b may effectively shield light leakage at the position where the edge liquid crystal driving of the black matrix 102 is insufficient and reduce the brightness of dark images so as to effectively reduce the risk of light leakage and improve the contrast. At the meanwhile, the surface of the light-shielding layer pattern 204b departing from the first substrate 101 has a surface roughness, and diffuse reflection of light may be achieved. By means of diffuse reflection of light, the light loss in ineffective areas may be reduced, and in turn it is possible to improve the brightness and reduce the energy consumption. For example, the high utilization rate of light source achieved by the diffuse light reflection effect of the surface of the light-shielding layer pattern 204b may counteract or reduce the case that the light flux of the display area of the display panel becomes smaller due to the relatively wide light-shielding layer pattern 204b.

Figure 4A:
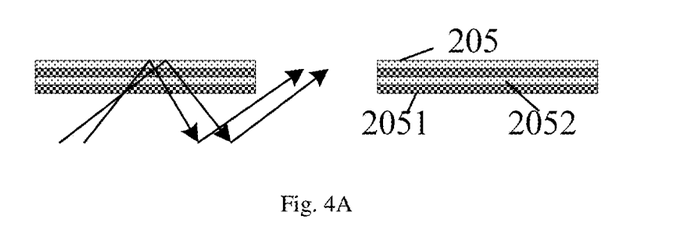
FIG. 4A shows a schematic diagram of a structure of a photonic crystal according to a third embodiment of this disclosure.

An embodiment of the disclosure provides a display panel, which is another variation of the display panel of the first embodiment. FIG. 4A shows a schematic diagram of a structure of a photonic crystal according to a third embodiment of this disclosure; and FIG. 4B shows a schematic diagram of a sectional structure of a display panel 400 according to a third embodiment of this disclosure.

Figure 4B:
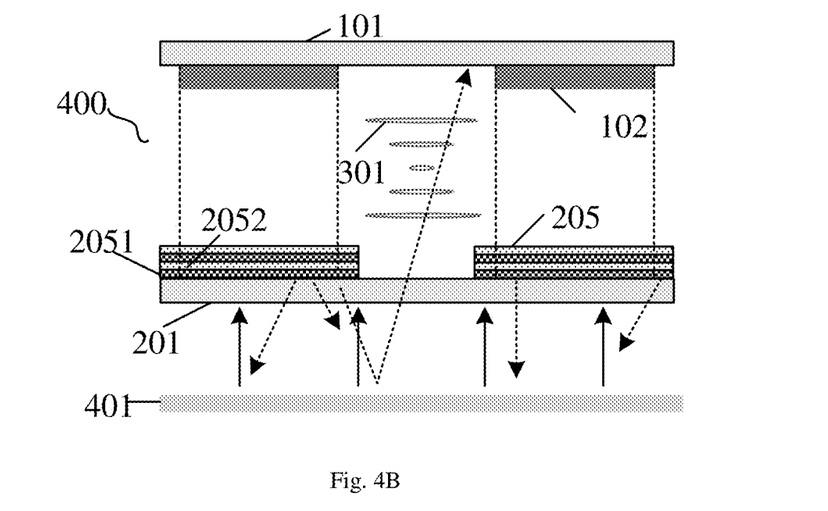
FIG. 4B shows a schematic diagram of a sectional structure of a display panel according to a third embodiment of this disclosure.

With reference to FIG. 4A and FIG. 4B, the structure of the display panel of this embodiment is substantially the same as the structure of the display panel described in FIG. 2A in the first embodiment, except that the light-shielding layer pattern 204 is replaced by a photonic crystal pattern 205.

With reference to FIG. 4A and FIG. 4B, the shape and the position of the photonic crystal pattern 205 is the same as those of the light-shielding layer pattern 204 shown in FIG. 2A in the first embodiment. In this embodiment, the line width of each photonic crystal line is greater than the line width of each black matrix line (as shown by dashed lines in the figure). For example, in this embodiment, the line width of the photonic crystal line is approximately 1.1 to 1.3 times that of the black matrix line. In the direction of line width, both sides of each photonic crystal line extend beyond both sides of each black matrix line respectively.

In an example of this embodiment, with respect to the design of the photonic crystal pattern 205, each photonic crystal line is designed to be substantially bilaterally symmetrically wider than the black matrix line. With respect to the photonic crystal in this embodiment, the existing configurations and materials may be used.

With reference to FIG. 4A and FIG. 4B, the photonic crystal pattern 205 is formed by sequentially and alternately laminating a plurality of silicon oxide layers and a plurality of silicon nitride layers. For example, in this embodiment, the first structure 2051 may be a silicon oxide film layer, and the second structure 2052 may be a silicon nitride film layer. Of course, this embodiment includes it but is not limited thereto. For example, the first structure 2051 may be a silicon nitride film layer, and the second structure 2052 may be a silicon oxide film layer. It is worth noting that the photonic crystal pattern 205 shown in FIG. 4A and FIG. 4B has four layers, but the number of film layers of the photonic crystal pattern 205 includes it but is not limited thereto. The specific number of film layers needs to be calculated and matched according to the overall thickness of the photonic crystal pattern 205 of the product design.

The photonic crystal is an artificial microstructure formed by periodical arrangement of media having different refractive indices. Since there is a spatial periodicity of the dielectric coefficient, periodical variation of spatial refractive index is caused. For example, when an adjustable multilayer structure is composed of two optical materials, the thickness of each layer corresponds to a quarter of the wavelength. Fresnel reflection occurs at each interface of the two layers of the materials. Under working wavelength, the optical path difference of reflected lights at two adjacent interfaces is half of a wavelength. Furthermore, the symbol of the reflection coefficient at the interface will also change. Therefore, all reflected lights at the interface are subjected to counteraction interference to obtain a very strong reflection. The reflectance is determined by the layer number of the materials and the refractive index difference between the materials. The reflection bandwidth is mainly determined by the refractive index difference.

In this embodiment, the photonic crystal pattern 205 is composed of a plurality of layers of silicon oxide having a refractive index approximately between 1.44 to 3.69 and a plurality of layers of silicon nitride having a refractive index of approximately 2.0, and the thickness of each dielectric layer may be selected according to the waveband to be reflected in visible light. For example, when an external light is radiated onto the surface of the photonic crystal pattern 205, a part of the external light may be reflected back to the back light source by the reflection on the surface of the photonic crystal pattern 205, and this may also increase the utilization rate of light source in ineffective areas. For example, the high utilization rate of light source achieved by the light reflection effect of the surface of the photonic crystal pattern 205 may counteract or reduce the case that the light flux of the display area of the display panel becomes smaller due to the relatively wide photonic crystal pattern 205.

It is to be indicated that in this embodiment, the shape and the position of the photonic crystal pattern 205 may also be the same as those of the light-shielding layer pattern 204 exemplified in FIG. 2B or FIG. 2C. That is, each black matrix line is provided in correspondence with two photonic crystal lines, or the photonic crystal pattern 205 is on the side of the second substrate 201 departing from the first substrate 101. When each black matrix line is provided in correspondence with two photonic crystal lines, with respect to remaining technical effects of the corresponding display panel in addition to the full light-reflecting effect described above in this embodiment, the technical effect of the structure of the display panel described in FIG. 2B may be referred to, and verbose words are omitted herein.

In this embodiment, each light-shielding line of the photonic crystal pattern 205 is provided in one-to-one correspondence with each black matrix line of the black matrix 102, and the line width of each photonic crystal line is greater than the line width of each black matrix line. Therefore, in the case that the aperture ratio is substantially not reduced, the photonic crystal pattern 205 may effectively shield light leakage at the position where the edge liquid crystal driving of the black matrix 102 is insufficient and reduce the brightness of dark images so as to effectively reduce the risk of light leakage and improve the contrast. Furthermore, the photonic crystal pattern 205 will relatively easily achieve reflection of light, and can increase the utilization rate of light source in ineffective areas, improve the brightness, and reduce the energy consumption.

An embodiment of the disclosure provides a display apparatus 20, which comprises the structure of the display panel of any embodiment in this disclosure.

For example, this display apparatus 20 may be a display device such as a liquid crystal display, a electronic paper display, and the like, and may be any product or member with display function comprising this display device, such as a television, a digital camera, a cell phone, a watch, a tablet computer, a notebook computer, a navigator, and the like.

Figure 5:
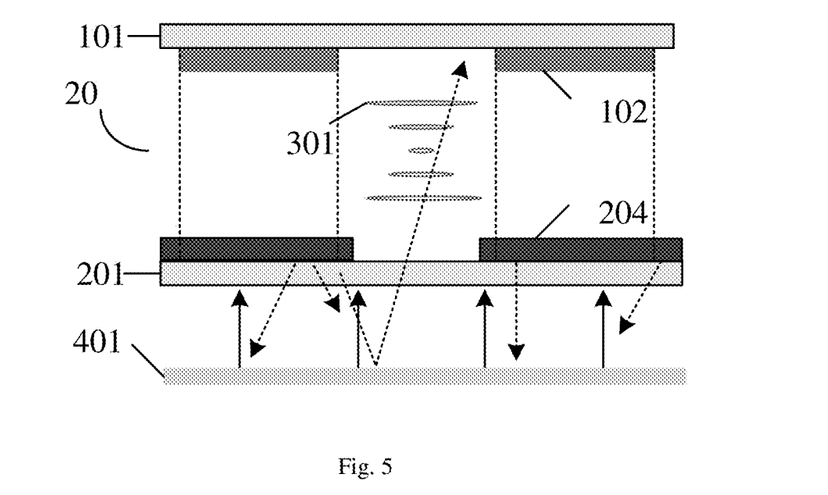
FIG. 5 shows a schematic diagram of a sectional structure of a display apparatus according to a fourth embodiment of this disclosure.

For example, as shown in FIG. 5, this display apparatus 20 may comprise a backlight unit 401. This backlight unit 401 is provided on one side of the second substrate 201 of the display panel, so that light radiation emitted from the backlight unit 401 is incident to the display panel through the light-shielding layer pattern 204.

In this embodiment, the backlight unit 401 may comprise a back panel, a light-reflecting layer (or a reflective layer), a light guide plate, a light source, and the like, and may also comprise a diffuser sheet, a prismatic sheet, and the like as needed. This backlight unit may be side-lit or direct-lit. The light emitted from the light source of the backlight unit 401 is converted by the light guide plate to a panel light source and is incident to the display panel. For example, the light emitted from the surface of the light guide plate or reflected back from the surface of the display panel may be then reflected back to the light guide plate by the light-reflecting layer and is incident to the display panel, and thus the utilization rate of light source is improved.

For example, as shown in FIG. 5, when the light provided by the back light source 401 is incident to the light-shielding layer pattern 204 via the second substrate 201, the reflection of the light occurs on the lower surface of the light-shielding layer pattern 204. If this lower surface is a rough surface, then this reflection is diffuse reflection; and if this lower surface is a smooth surface, then this reflection is specular reflection. For example, the light is subjected to several reflections of the light-reflecting layer of the backlight unit 401 and several reflections of the surface of the light-shielding layer pattern 204, and the light of the area shielded by the light-shielding layer pattern 204 may be transmitted through the position of the pixel opening. Therefore, in the case that optical index matching films are not additionally increased, the utilization rate of light source in ineffective areas may be further increased. For example, the higher utilization rate of light source achieved under the coaction of the light-reflecting effect of the light-reflecting layer of the backlight unit 401 and the light-reflecting effect of the surface of the light-shielding layer pattern 204 may counteract or reduce the case that the light flux of the display area of the display panel becomes smaller due to the relatively wide light-shielding layer pattern 204.

For example, as shown in FIG. 5, when the display panel of the display apparatus 20 in this embodiment is as described in the third embodiment (i.e., the light-shielding layer pattern 204 of the display panel of the display apparatus of in this embodiment is replaced by the photonic crystal pattern 205), and when the light provided by the back light source 401 is incident to the surface of the photonic crystal pattern 205 via the second substrate 201, the reflection of the light will relatively easily occur on the surface of the photonic crystal pattern 205. Therefore, when the light provided by the back light source 401 is incident to the surface of the photonic crystal pattern 205 via the second substrate 201, the light is subjected to several reflections of the light-reflecting layer of the backlight unit 401 and several reflections of the surface of the photonic crystal pattern 205, and the light of the area shielded by the photonic crystal pattern 205 may be transmitted through the position of the pixel opening. Therefore, the utilization rate of light source in ineffective areas may be further increased. For example, the high utilization rate of light source achieved under the coaction of the light-reflecting effect of the light-reflecting layer of the backlight unit 401 and the light-reflecting effect of the surface of the photonic crystal pattern 205 may counteract or reduce the case that the light flux of this display area of the display panel becomes smaller due to the relatively wide photonic crystal pattern 205.

It is to be indicated that the whole structure of this display apparatus 20 is not provided for clear illustration. In order to achieve the necessary functions of the display apparatus, other structures which are not shown may be provided by the person skilled in the art according to particular application circumstances, and this is not limited in embodiments of this disclosure.

With respect to other technical effects of the display apparatus 20 provided in this embodiment, the technical effects of the structures of the display panels described in the above first, second, and third embodiments may be referred to, and verbose words are omitted herein.

An embodiment of the disclosure provides a method for producing a display panel. FIG. 6A-6F show sectional views of a method for producing a display panel according to a fifth embodiment of this disclosure.

Figure 6A:
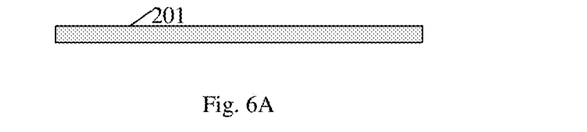
FIGS. 6A-6F show sectional views of a method for producing a display panel according to a fifth embodiment of this disclosure.

As shown in FIG. 6A, a second substrate 201 is provided, which may be a transparent insulator. The example of the material used for the second substrate 201 includes a glass substrate, a quartz substrate, a plastic substrate, or other suitable materials. For example, the second substrate 201 may be firstly cleaned to remove the foreign matters having physicochemical properties and electrical properties which influence film forming on the surface of the second substrate 201 as well as dust, oil contents, natural oxides, and the like attached to the surface of the substrate.

Figure 6B:
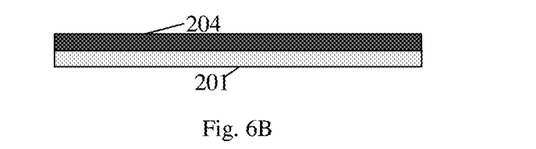

As shown in FIG. 6B, in order to form the light-shielding layer pattern 204, a metal light-shielding layer, such as, a metal layer is formed on the whole surface of the second substrate 201. The example of the material used for this metal layer includes silver, aluminum, chromium, copper, molybdenum, titanium, an aluminum neodymium alloy, a copper molybdenum alloy, a molybdenum tantalum alloy, a molybdenum neodymium alloy, or any combination thereof. For example, the metal layer may be formed by magnetron sputtering deposition treatment, and the metal layer formed has a thickness of approximately 500 Å.

Figure 6C:
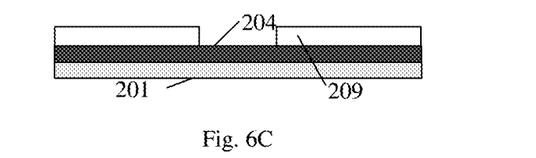

As shown in FIG. 6C, after the metal layer is formed, a photoresist film is formed on the whole surface of the metal layer. Patterning is performed on the photoresist film by a lithographic treatment including an exposing procedure and a developing procedure to form a photoresist pattern 209 having a shape corresponding to the desired light-shielding layer pattern 204 on the metal layer.

Figure 6D:
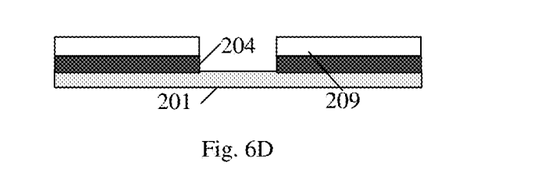

As shown in FIG. 6D, patterning is performed on the metal layer 204 by using the photoresist pattern 209 as an etching mask to form the light-shielding layer pattern 204 on the second substrate 201. For example, the light-shielding layer pattern 204 formed has the same shape as that of the black matrix 102 on the other substrate (i.e., the first substrate), and the light-shielding line of the light-shielding layer pattern 204 formed is in one-to-one correspondence with the black matrix line of the black matrix 102. In this embodiment, the line width of the light-shielding line formed is at least partly greater than the line width of a corresponding black matrix line (as shown by dashed lines in the figure). For example, in this embodiment, the line width of the light-shielding line is approximately 1.1 to 1.3 times that of the black matrix line. For example, in the direction of line width, both sides of each light-shielding line extend beyond both sides of each black matrix line respectively. It is worth noting that in this embodiment, with respect to the design of the light-shielding layer pattern 204, each light-shielding line is designed to be substantially bilaterally symmetrically wider than the black matrix line.

Figure 6E:
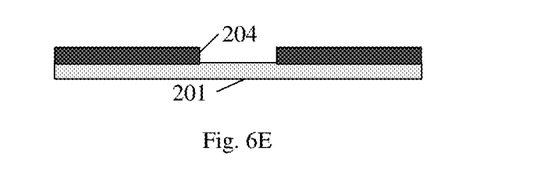

As shown in FIG. 6E, the photoresist pattern 209 is removed by a peeling process, and the light-shielding layer pattern 204 is left on the second substrate 201.

Figure 6F:
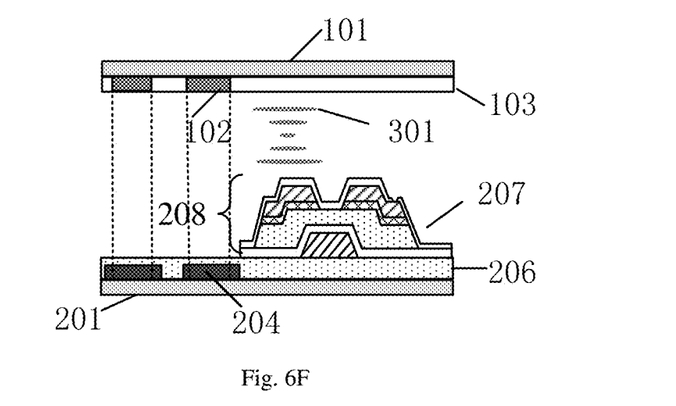

As shown in FIG. 6F, in order to form the display panel, an insulating layer 206 covering the light-shielding layer pattern 204 is formed on the second substrate 201. This insulating layer 206 may be used as a planarizing layer so as to obtain a flat surface. It may also be used as a buffering layer to prevent foreign ions in the second substrate 201 from diffusing into the circuit layer subsequently formed. The example of the material of the insulating layer 206 includes silicon nitride, silicon oxide, or other suitable materials.

After the insulating layer 206 is formed, a circuit layer used for the array substrate is formed on the insulating layer 206. For example, a gate electrode, a gate insulating layer, a semiconductor layer, and a source/drain electrode are sequentially formed to form a thin film transistor 208. Thereafter, the structures such as a passivation layer, a pixel electrode, and the like may be further formed. For example, in an example of a horizontal electric field type array substrate, a common electrode may also be formed. This common electrode may be located in a layer which is different from or the same as that of the pixel electrode.

For example, after the thin film transistor 208 is formed, a passivation layer 207 covering the source/drain electrode is formed. The example of the material of the passivation layer includes silicon oxide, silicon nitride, or other suitable inorganic materials, or for example, organic materials such as a resin.

After the passivation layer 207 is formed, a pixel electrode is formed from a transparent conductive material (for example ITO, IZO, and the like) on the passivation layer 207.

As shown in FIG. 6F, a first substrate 101, which is provided oppositely to the second substrate 201 and is formed with the black matrix 102, is provided. For example, this black matrix exhibits a grid shape and each opening, for example, corresponds to a sub-pixel unit. The black matrix line is provided between two adjacent sub-pixels.

For example, after the black matrix 102 is formed on the first substrate 101, a color filter 103 may be further formed. The color filter 103 may be formed from, for example, a color resin material, which may be, for example, a red, green, or blue resin, and the like.

Thereafter, the first substrate 101 and the second substrate 201 are cell-aligned and bonded by a sealant to form a liquid crystal cell, and a liquid crystal layer 301, a spacer, and the like. are provided between the first substrate 101 and the second substrate 201.

In at least one example of this embodiment, each light-shielding line of the light-shielding layer pattern 204 is provided in one-to-one correspondence with each black matrix line of the black matrix 102, and the line width of each light-shielding line is greater than the line width of each black matrix line. Therefore, in the case that the aperture ratio is substantially not reduced, the light-shielding layer pattern 204 may effectively shield light leakage at the position where the edge liquid crystal driving of the black matrix 102 is insufficient and reduce the brightness of dark images so as to effectively reduce the risk of light leakage and improve the contrast. At the meanwhile, the surface of the light-shielding layer pattern 204 composed of a metal has a light-reflecting property. External light (for example, the back light source 401 used for this liquid crystal panel) may be subjected to specular reflection or diffuse reflection several times by the surface of the light-shielding layer pattern 204, and is finally transmitted through the position of the pixel opening. It is possible to reduce the light loss in ineffective areas of this display panel, improve the brightness, and reduce the energy consumption.

It is to be indicated that the whole structure of the display panel of this embodiment is not provided for clear illustration. In order to achieve necessary functions of the display panel, other structures which are not shown may be provided by the person skilled in the art according to particular application circumstances, and this is not limited in this disclosure.

FIGS. 7A to 7G show sectional views of a method for producing a display panel according to a sixth embodiment of this disclosure. The method of this embodiment is the same as the method shown in FIGS. 6A to 6F, except for the procedures of providing the second substrate 201 and forming the light-shielding layer pattern 204b. Therefore, the detailed forming processes of constituent elements having the same name and reference numeral will be based on the illustration of FIG. 6A to FIG. 6F, and different parts will be mainly discussed below.

Figure 7A:
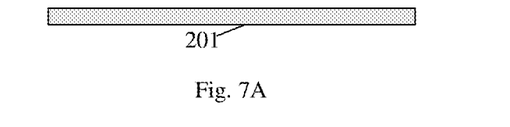
FIGS. 7A-7G show sectional views of a method for producing a display panel according to a sixth embodiment of this disclosure.
Figure 7B:
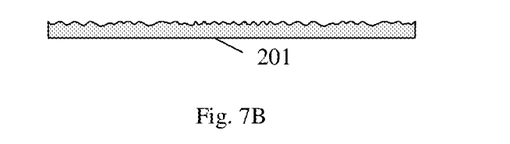

As shown in FIG. 7B, the surface of the second substrate 201 facing to the first substrate 101 is subjected to roughening treatment. This roughening treatment may be a physical method or a chemical method. The physical method includes a sand blasting process; and the chemical method includes an etching method, such as dry etching or wet etching. The dry etching is exemplified. For example, a fluorine-based etching agent ($CF_4$, $CHF_3$, $SF_6$, and the like) may be used to perform surface roughening treatment on the surface of the second substrate 201 facing to the first substrate 101 so as to increase the surface roughness of the second substrate 201. For example, the surface roughness Ra of the second substrate 201 formed in this embodiment may be approximately 1.0 to 2.0 micrometers.

Figure 7C:
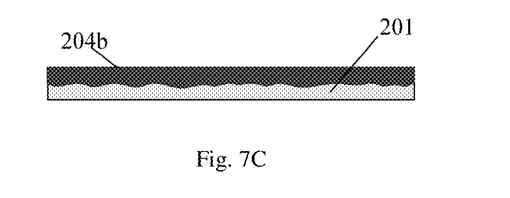
Figure 7D:
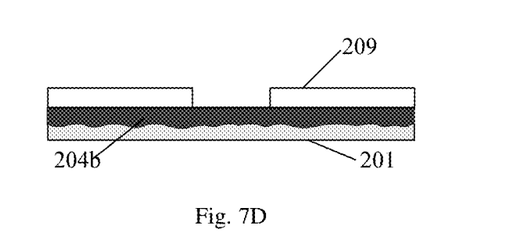
Figure 7E:
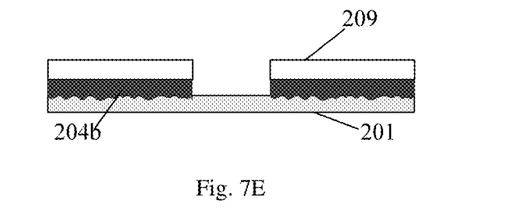
Figure 7F:
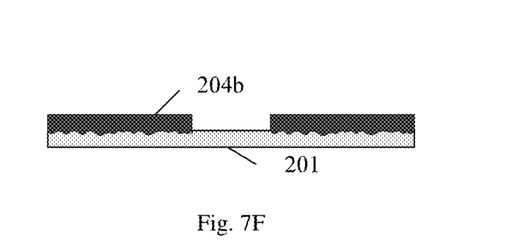
Figure 7G:
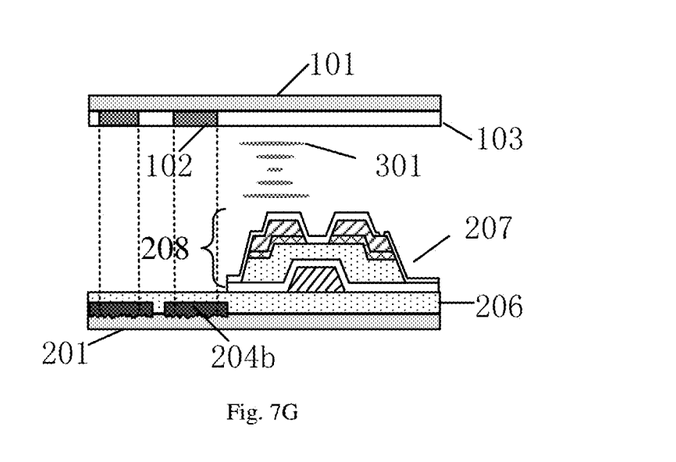

As shown in FIG. 7C, in order to form the light-shielding layer pattern 204b, a metal layer is formed on the whole surface of the second substrate 201. The example of the material used for this metal layer include silver, aluminum, chromium, copper, molybdenum, titanium, an aluminum neodymium alloy, a copper molybdenum alloy, a molybdenum tantalum alloy, a molybdenum neodymium alloy, or any combination thereof. For example, the metal layer may be formed by magnetron sputtering deposition treatment, and for example, the metal layer formed has a thickness of approximately 500 Å. Since the surface of the second substrate 201 facing to the first substrate 101 is rough, a metal layer of which the surface in contact with the second substrate 201 has a surface roughness will be obtained in the process of deposition of the metal layer. By means of the same treatment of a photolithographic process as described in the above embodiments, a light-shielding layer pattern 204 of which the surface in contact with the second substrate 201 has a certain roughness will be finally obtained.

Therefore, in this embodiment, the light-shielding layer pattern 205 formed may effectively shield light leakage at the position where the edge liquid crystal driving of the black matrix 102 is insufficient and reduce the brightness of dark images so as to effectively reduce the risk of light leakage and improve the contrast. Furthermore, since the surface of the light-shielding layer pattern 205 formed in contact with the second substrate 201 has a surface roughness, when an external light (for example, the back light source 401 used for this liquid crystal panel) is incident to the light-shielding layer pattern 204 through the second substrate 201, the light is subjected to diffuse reflection on the rough lower surface of the light-shielding layer pattern 204. The light is subjected to several diffuse reflections of the surface of the light-shielding layer pattern 204, and the light of the area shielded by the light-shielding layer pattern 204 may be transmitted through the position of the pixel opening. The light loss in ineffective areas may be reduced, and in turn it is possible to improve the brightness and reduce the energy consumption.

Furthermore, when the light-shielding layer pattern is formed on the surface of the side of the second substrate departing from the first substrate, the light-shielding layer pattern formed may also be subjected to roughening treatment to form a rough surface. This roughening treatment may also be a physical method or a chemical method. The physical method includes a sand blasting process; and the chemical method includes an etching method, such as dry etching or wet etching.

It is to be indicated that the whole structure of this display panel is not provided for clear illustration. In order to achieve necessary functions of the display panel, other structures which are not shown may be provided by the person skilled in the art according to particular application circumstances, and this is not limited in this disclosure.

The following points should be demonstrated:

(1) The accompanying drawings of the embodiments of this disclosure merely relate to the structures related to the embodiments of this disclosure, and with respect to other structures, the general designs may be referred to.

(2) For clarity, in the accompanying drawings used to describe the embodiments of this disclosure, the thicknesses of layers or areas are magnified or reduced. That is, these accompanying drawings are not depicted according to practical scales. It can be understood that when an element such as a layer, a film, an area, a substrate, or the like is referred to as being located "on" or "under" another element, this element may be "directly" located "on" or "under" another element or there may be an intermediate element.

(3) The embodiments in this disclosure and features in the embodiments may be combined with each other to obtain new embodiments without being conflicted.

Those described above are merely exemplary embodiments of this disclosure, but are not intended to limit the scope of this disclosure. The scope protected by this disclosure is determined by the appended claims.

What is claimed is:

1. A display panel, comprising:
    a first substrate which is provided with a black matrix and a plurality of sub-pixels in an array arrangement, wherein black matrix lines of the black matrix are provided between adjacent sub-pixels;
    a second substrate which is provided oppositely to the first substrate and is provided with a light-shielding layer pattern comprising light-shielding lines; and
    a liquid crystal layer which is provided between the first substrate and the second substrate;
    wherein the light-shielding layer pattern has a light-reflecting property and is located on a side of the second substrate facing the first substrate,
    wherein:
        each black matrix line of the black matrix is provided in correspondence with at least two adjacent light-shielding lines, an orthographic projection of a first one of the at least two adjacent light-shielding lines on the second substrate in a direction perpendicular to the surface of the second substrate extends beyond an orthographic projection of the black matrix line on the second substrate in the direction perpendicular to the surface of the second substrate on a first side of the black matrix line, and an orthographic projection of a second one of the at least two adjacent light-shielding lines on the second substrate in the direction perpendicular to the surface of the second substrate extends beyond the orthographic projection of the black matrix line on the second substrate in the direction perpendicular to the surface of the second substrate on a second side of the black matrix line; and
        a gap is provided between the first one and the second one of the at least two adjacent light-shielding lines, and an orthographic projection of the gap on the first substrate falls within a range of an orthographic projection of the corresponding black matrix line of the black matrix on the first substrate; and
    wherein the first substrate is provided at a light emitting side of the display panel, and the second substrate is provided at a light incident side of the display panel.

2. The display panel according to claim 1, wherein a line width of the light-shielding lines is approximately 1.1 to 1.3 times that of the black matrix lines.

3. The display panel according to claim 1, wherein the light-shielding layer pattern is formed of a photonic crystal.

4. The display panel according to claim 3, wherein the photonic crystal comprises a plurality of silicon oxide layers and a plurality of silicon nitride layers which are alternately laminated.

5. A display apparatus, comprising the display panel according to claim 1.

6. The display apparatus according to claim 5, further comprising a backlight unit, wherein the backlight unit is provided on one side of the second substrate, so that a light emitted from the backlight unit enters the display panel through the light-shielding layer pattern of the display panel.

* * * * *